United States Patent [19]
Jamison et al.

[11] Patent Number: 6,015,459
[45] Date of Patent: Jan. 18, 2000

[54] METHOD FOR DOPING SEMICONDUCTOR MATERIALS

[75] Inventors: Keith D. Jamison; Mike L. Kempel, both of Austin, Tex.

[73] Assignee: Extreme Devices, Inc., Austin, Tex.

[21] Appl. No.: 09/105,420

[22] Filed: Jun. 26, 1998

[51] Int. Cl.[7] ................................................. C30B 33/06
[52] U.S. Cl. .............................. 117/2; 438/510; 117/105; 117/971
[58] Field of Search ................................ 117/2, 105, 951; 438/510

[56] References Cited

U.S. PATENT DOCUMENTS

| | | | |
|---|---|---|---|
| 3,956,032 | 5/1976 | Powell et al. | 117/101 |
| 4,788,082 | 11/1988 | Schmitt | 427/248.1 |
| 5,164,040 | 11/1992 | Eres et al. | 427/600 |
| 5,256,205 | 10/1993 | Schmitt, III et al. | 118/723 MW |
| 5,354,584 | 10/1994 | Schmidt | 427/530 |
| 5,356,673 | 10/1994 | Schmitt, III et al. | 427/446 |
| 5,463,978 | 11/1995 | Larkin et al. | 117/89 |

OTHER PUBLICATIONS

Ferguson, B.A. and Mullins, C.B. "Supersonic jet epitaxy of III–nitride semiconductors", Journal of Crystal Growth, vol. 178: 134–146, 1997.

"Site–competition Epitaxy for N–type and P–type Dopant Control in CVD SiC Epilayers", Paper presented at Silicon Carbide and Related Materials 1995 Conf., Kyoto, Japan.

"Site–competition Epitaxy for Superior Silicon Carbide Electronics", *Appl. Phys. Lett.* 65 (13), Sep. 26, 1994.

"Aluminum Doped 6H SiC: CVD Growth and Formation of Ohmic Contacts", Paper presented at *Silicon Carbide and Related Materials 1995 Conf.*, Kyoto Japan.

"Atomic and Moleculr Beam Methods", *Oxford University Press*, 1988, Chapter 2.

"Epitaxial Growth of 3C–SiC on Si(100) by Pulsed Supersonic Free Jets of $Si(CH_3)_4$ and $Si_3H_8$", *J. Vac. Sci. Technol. A* 16(2), Mar./Apr. 1998.

"Monte Carlo Analysis of a Hyperthermal Silicon Deposition Process", *J. Vac. Sci. Technol. A* 16(2), Mar./Apr. 1998.

"Growth and Characterization of Silicon Thin Films Employing Supersonic Jets", *J. Vac. Sci. Technol A* 15(4), Jul./Aug. 1997.

"Sterling Semiconductor Silicon Carbide Materials for Next–generation Semiconductors", *Sterling Semiconductor Web Page*, Apr. 21, 1998.

"Recent Progress in Silicon Carbide Semiconductor Electronics Technology", NASA Lewis SiC Home Page, May 1998.

"In Situ P–and N–type Doping of Low–temperature Grown $\beta$–SiC Epitaxial Layers on Silicon", Paper presented at *Silicon Carbide and Related Materials 1995 Conf.*, Kyoto, Japan.

"Seeded Pulsed Supersonic Molecular Beam Growth of Silicon Carbide Thin Films", *J. Vac. Sci. Thechnol. A* 16(3), May/Jun. 1998.

"Molecular–jet Chemical Vapor Deposition of SiC", Paper presented at *Silicon Carbide and Related Materials 1995 Conf.*, Kyoto, Japan.

"Epitaxial Growth of $\beta$–SiC by Tetramethylsilane Supersonic Free Jets: Precursor Control Effects", Paper presented at *Silicon Carbide and Related Materials 1995 Conf.*, Kyoto, Japan.

*Primary Examiner*—Robert Kunemund
*Assistant Examiner*—Donald L. Champagne
*Attorney, Agent, or Firm*—Baker & Botts, L.L.P.

[57] ABSTRACT

Method is provided for controlling the concentration of a dopant introduced into an epitaxial film during CVD or sublimation growth by controlling the energy of dopant atoms impinging on the film in a supersonic beam. Precursor materials may also be introduced by supersonic beam. Energy of the dopant atoms may be changed by changing flow conditions in the supersonic beam or changing carrier gases. Flow may be continuous or pulsed. Examples of silicon carbide doping are provided.

12 Claims, 7 Drawing Sheets

METHOD FOR DOPING SEMICONDUCTOR MATERIALS

BACKGROUND OF THE INVENTION

1. Field of the Invention

This invention relates to the fabrication of doped epitaxial layers of semiconductor materials. More particularly, method is provided for doping of the epitaxial layer by directing a supersonic beam carrying dopant atoms onto the epitaxial layer during growth.

2. Description of Related Art

Development of alternative semiconductor materials for electronic and optical devices is of interest because silicon and gallium arsenide cannot currently meet some of the power, frequency, temperature and speed requirements of the next generation of electronic and optical devices. Silicon carbide (SiC) has many of the required properties, such as wide bandgap, high electric field breakdown, high thermal conductivity, high saturated electron drift velocity and good physical strength, that make it attractive for many of these applications. There are now commercially available reproducible single crystal wafer SiC substrates in the 6H and 4H polytypes. As substrate quality continues to improve, more devices will be fabricated from this material. Among these devices are high-power switches, high-voltage high-frequency devices for cellular telephone communications and high definition television transmission, high-temperature electronics, blue emitters for high-density data storage and other devices.

One of the most important challenges that needs to be overcome for the realization of advanced electronic devices using SiC is control over the electronic properties of the epitaxial layers grown. This requires control over the doping of SiC. Silicon carbide crystals are grown either by sublimation ("Lely process") or by chemical vapor deposition (CVD). Post-growth doping techniques are not effective in SiC crystals. Ion implantation, known for some doping applications (U.S. Pat. No. 5,354,584), causes crystal damage which can only be removed by annealing, and the annealing results in excessive dopant redistribution. Therefore, doping during sublimation or CVD growth of epitaxial layers is the process likely to be used for commercial production of SiC devices. Unintentional n-type doping by nitrogen incorporation during CVD-growth of epitaxial layers remains a problem. Until recently, doping levels have been confined to the range of $N_d \cong 2\times10^{16}$ cm$^{-3}$ to $5\times10^{18}$ cm$^{-3}$ for n-type carriers and $N_a \cong 2\times10^{16}$ cm$^{-3}$ to $1\times10^{18}$ cm$^{-3}$ for p-type carriers. (D. J. Larkin et al, *Appl. Phys. Lett.* 65 (1994), 1659)

In recent years, control over doping of CVD-grown layers has been improved using a process called site competition epitaxy. (U.S. Pat. No. 5,463,978). Site competition epitaxy is a dopant control technique based on adjusting the Si/C ratio within the growth chamber to control the amount of dopant incorporated into substitutional SiC crystal lattice sites. These sites are either carbon lattice sites (C-sites) or silicon lattice sites (Si-sites) located on the active SiC growth surface. This process is based on the principle of competition between nitrogen and carbon for the C-sites and between aluminum and silicon for the Si-sites of the growing silicon carbide epitaxial layer. The concentration of n-type (nitrogen) dopant atoms incorporated into a growing silicon carbide epitaxial layer is decreased by increasing the carbon-source concentration, so that C out-competes N for the C-sites. Analogously, the amount of p-type dopant (aluminum) incorporated into the growing silicon carbide layer is decreased by increasing the silicon-source concentration within the growth chamber so that Si out-competes Al for the Si-sites. This process has been used to dope SiC from a p-type doping level of $<1\times10^{14}$ cm$^{-3}$ to n-type doping level of $>1\times10^{19}$ cm$^{-3}$.

The use of site-competition epitaxy, relying on changing the C/Si ratio to control the doping level, affects other properties of the SiC growth, such as growth rate and crystal quality. These other changes could have detrimental effects on a device. In addition, it is very difficult to rapidly change the C/Si ratio during growth—making abrupt doping level changes difficult to obtain.

The use of supersonic jets for thin film deposition has recently been studied experimentally (K. A. Pacheco et al, "Growth and characterization of silicon thin films employing supersonic jets," *J. Vac. Sci. Technol. A* 15(4), July/August 1997) and by theoretical analysis (G. Chen et al, "Monte Carlo analysis of a hyperthermal silicon deposition process," *J. Vac. Sci. Technol. A* 16(2), March/April 1998). With this technique, epitaxial layers are formed by seeding precursor molecules in a supersonic beam of light carrier gas. The precursor molecules are accelerated to the high velocity of the beam by the light carrier gas and then impinge at a high energy on a substrate, resulting in a greatly enhanced epitaxial growth rate compared with conventional CVD deposition. Supersonic jet molecular beams were originally suggested as a replacement for effusive gas sources where the supersonic jet of gas travels through a nozzle in the intended beam direction of the effusion source. Using supersonic beams removes the effect of the effusion constraint (Knudsen number >1) on the mean free path of the molecular beam. The advantages of this approach are beam intensities on the order of 1000-times those available from effusive sources, extremely long mean free path, and narrow energy spread in the beam as a result of cooling of the gas by isentropic expansion. Most of the studies of supersonic beams have been applied to the growth of silicon, but heteroepitaxial growth of SiC on silicon by pulsed supersonic free jets has been investigated (Y. Ikoma et al, "Epitaxial growth of 3C—SiC on Si by pulsed supersonic free jets . . . ," *J. Vac. Sci. Technol. A* 16(2), March/April 1998; K. D. Jamison et al, "Seeded pulsed supersonic molecular beam growth of silicon carbide thin films," *J. Vac. Sci. Technol. A* 16(3), May/June 1998).

The properties of supersonic beams are described in the book *Atomic and Molecular Beam Methods* (ed. G. Scoles, 1988), especially in Vol. 1, Ch. 2. The energy of dopant molecules in a supersonic beam can be changed using a number of methods that either change the terminal velocity of the beam or change the mass ratio between the seed (dopant) molecule and the carrier gas in the beam. For a supersonic beam to impinge on a substrate at high velocity, it is necessary that collisions between the beam molecules and resident gas around the substrate be practically eliminated. Therefore, it is necessary that pressure in the growth chamber be reduced. The configuration of the beam, any "skimmer" or beam-defining device, the substrate, and the nozzle through which the gases enter a growth chamber are predictable using the theory presented in the book and by other calculation methods such as the Chen et al paper referenced above.

While growth of SiC devices is known by sublimation or by CVD and incorporation of dopants into the growing crystal is known, better methods are needed for controlling dopant levels in SiC. Better methods for controlling dopant levels are also needed for growth of other semiconductor materials. The methods should make possible change of dopant level without change of another growth variable which could affect crystal quality and have detrimental effects on a device.

SUMMARY OF THE INVENTION

Methods are provided for growing semiconductor films by CVD and incorporating dopants while the film is growing by impinging a supersonic gas stream carrying the dopant on the surface of the growing film. The gas stream contains predominantly a carrier gas and is seeded with the dopant material. The dopant material and its concentration in the gas stream are selected to provide the desired concentration of dopant in the semiconductor film.

While the method may be applied to growth of many different semiconductor materials, the method described will be for the growth of silicon carbide (SiC) crystals. The improved CVD method includes preparing the crystal for growth, heating the crystal in the growth chamber, introducing carrier gases, vaporizing the crystal-growing compounds, introducing these compounds along with the carrier gas into the growth chamber in a supersonic jet expansion, and maintaining proper kinetic energy levels and flow rates of the growth compounds for a sufficient time to grow a crystal film having the desired smooth surface morphology, a uniform thickness, a low-defect density with a controlled dopant profile. The crystal may be doped to form p- or n-type crystals at a controlled dopant level. The improved crystal growth process is based on the discovery that the amount of dopant incorporation into the growing film is dependent on the kinetic energy of the arriving dopant atoms and that the dopant concentration can be changed by varying the kinetic energy of the arriving dopant atoms without varying any other parameter.

DESCRIPTION OF THE PREFERRED EMBODIMENTS

Figure 1:
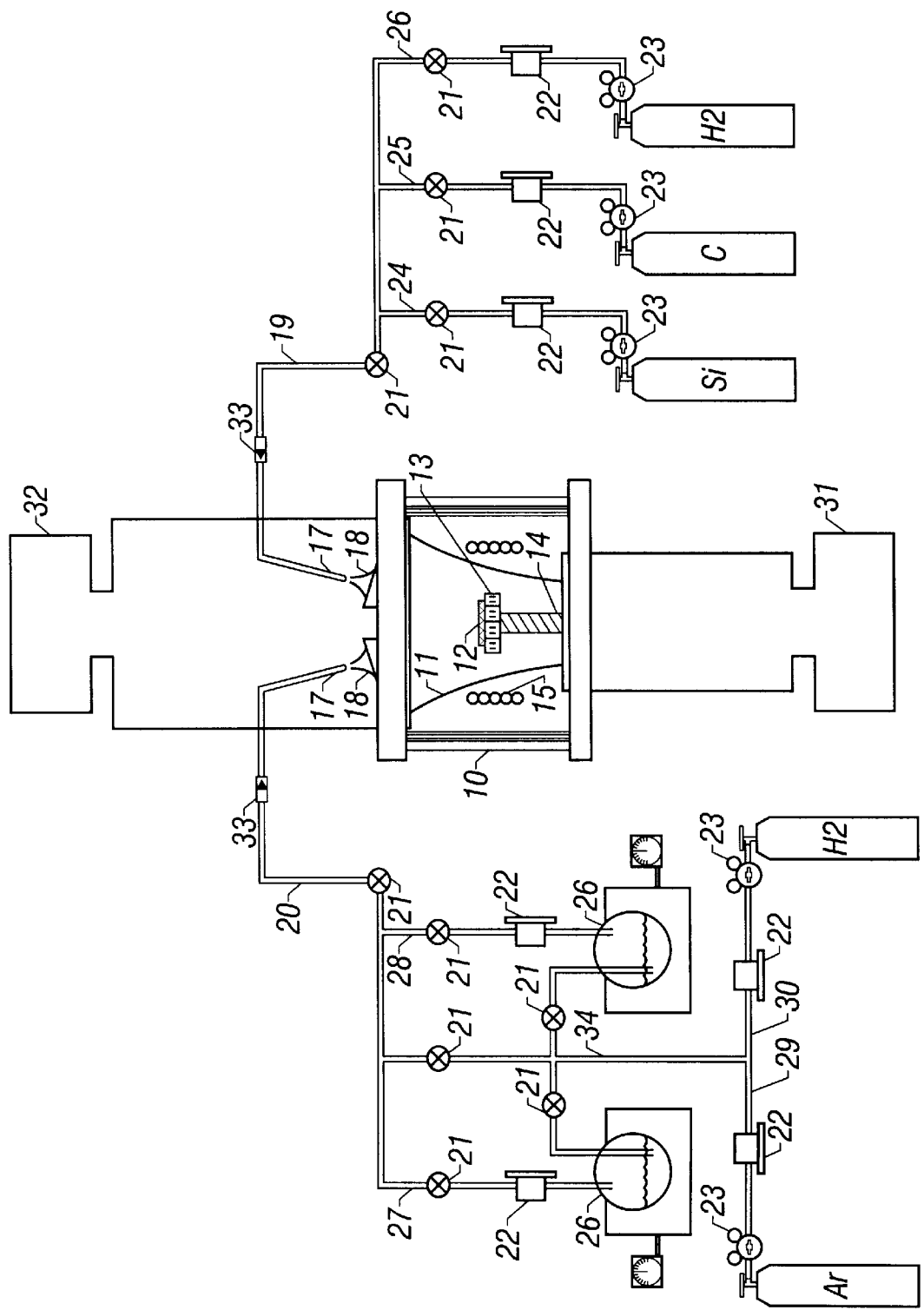
FIG. 1 is a sketch of the growth system for carrying out the method of the invention.

Referring to FIG. 1, a suitable CVD growth system for carrying out the process of the invention is shown. A portion of growth chamber 10 is preferably formed from concentric quartz tubes, the space between the tubes forming a water jacket such that the inner quartz tube can be water-cooled. Inner quartz tube 11 is preferably conically shaped. Substrate 12 is supported by graphite susceptor 13, which is in turn supported by quartz support 14. Quartz support 14 can be rotated to improve growth uniformity on substrate 12. Radio-frequency (RF) induction coil 15 is placed around inner growth chamber quartz tube 11 and is powered by a high-power RF generator (not shown). The RF field produced by induction coil 15 heats substrate 12 via susceptor 13 to a desired temperature. When a SiC film is grown, substrate 12 is preferably a SiC crystal.

Gaseous crystal growth precursors and dopant gases are introduced into growth chamber 10 through apertures 17 and skimmers 18. Apertures 17 are selected to have sizes dependent on growth conditions to be attained, but may, for example, be about 0.5 mm diameter. Skimmer 18 functions to limit the beam area impinging on a substrate and provide more uniform conditions of growth and more uniform distribution of dopant gases impinging on substrate 12, but it is not essential. The pressure difference across apertures 17 causes a supersonic beam to be formed in the growth chamber side of the aperture. The pressure in the growth chamber is low enough and the configuration in the growth chamber is such that the growth precursors remain supersonic until they strike the growth surface. The distance $X_M$ over which supersonic flow exists downstream of a nozzle in a free jet is approximated by the expression:

$$X_M \approx 0.67 d \sqrt{\left(\frac{P_o}{P_b}\right)} \quad \text{(Eq. 1)}$$

Growth gases are brought to their aperture 17 through primary growth line 19 and the dopant gases are brought to their aperture 17 by dopant growth line 20. After passing through aperture 17 and skimmer 18 growth gases strike the substrate at supersonic velocities. Non-sticking gases are exhausted by vacuum pump 31 through a conduit located below substrate 12.

Precursor gaseous compounds are connected to primary growth line 19 and gas flow is regulated by valves 21, mass flow controllers 22 and pressure regulators 23 on each source of precursor material and carrier gas. In FIG. 1 these are denoted as silicon, carbon and hydrogen. For growth of SiC, the precursor materials will normally be a silane compound and propane. Dopants are introduced into dopant growth line 20 by valves 21, mass flow controllers 22 and pressure regulators 23 on each source of dopant. Two carrier gases, argon and hydrogen, may be used individually or may be mixed in dopant carrier gas line 34. Other carrier gases may be used. The ratio of carrier gases controls the effective mass of the carrier gas and thus the kinetic energy of the dopant. Once the carrier gases are mixed they carry the dopants to dopant aperture 17. Dopant carrier gas may be partially diverted through liquid organometallic compounds in containers 26 at controlled temperatures to saturate the carrier gases with a selected amount of dopant material.

Substrate 12 is preferably pretreated to remove any contaminants or impurities on the surface so as to facilitate the growth of high-quality, low-defect-density epitaxial films. Substrate 12 may be cut such that the surface is slightly mis-oriented from the basal plane by some tilt angle. (1–8 degrees) The tilt angle depends on the substrate (for SiC, whether it is 4H, 6H or 3C). Polished 4H and 6H SiC substrates with the proper orientation for CVD growth can be purchased commercially from Cree Research, Inc. of Durham, N.C.

Once a substrate surface has been polished and made ready for growth, substrate 12 is placed in growth chamber 10. Pre-growth treatments such as HCl etching of the SiC substrate or reactive ion etching may be performed on the surface prior to growth. Once the pretreatment is finished, growth chamber 10 is prepared for growth, preferably by evacuating with a turbomolecular or other vacuum pump 31 and the skimmer chamber is evacuated through skimmer vacuum pump 32, preferably a diffusion pump or Roots blower backed by a roughing pump. Hydrogen gas may be used to purge the entire vacuum system. Once the growth chamber is purged, the carrier gas flow rates and the temperature of the sample within the growth chamber are brought to growth conditions. Hydrogen gas is preferably used as the carrier gas when only one gas is used, but other gases (e.g. noble gases) can be used. These include helium, argon, neon and mixtures of these gases. Once the temperature and flow within the reaction chamber have reached equilibrium, generally within a few minutes, silane and propane are added to the carrier gas. To keep the pressure difference between the growth gas and growth chamber large enough for the supersonic beam to strike the crystal, the gas source may be turned on and off using pulse valve 33. Preferably the silane concentration and propane concentration are in the range of about 0.1%, but other concentrations may be used for good growth. The ratio between silicon and propane is kept constant once the optimum flux ratio is determined. After growth is started, when p- or n-type impurities are desired in the crystal, a mixture of two carrier gases, preferably hydrogen and argon, is mixed with a dopant (preferably acetonitrile for n-type doping and trimethylaluminum (TMA) for p-type doping) and introduced to the growth chamber using the dopant line (17 or 18). By changing the mixture of the carrier gases, the kinetic energy of the dopant atoms can be varied, resulting in different levels of dopant being incorporated into the growing crystal.

Although the process has been described heretofore under conditions that the growth gases are introduced into growth chamber 10 so as to attain supersonic velocity upon entering, it should be understood that the process of this invention can be used if only the dopant gases are supersonic and the growth gases are introduced in the normal manner, as long as the base pressure in the growth chamber is low enough to allow the dopant beam to remain supersonic when it strikes the substrate. It should also be understood that other gases may be used as a carrier gas, a source of Si, as a carbon source, or as the dopant source. Examples are disilane as a source of silicon with methane or ethane as a source of carbon, or hexamethydisilane as a source of both silicon and carbon. Other dopants that may be used with SiC include ammonia and acetonitrile as sources of nitrogen. If organic compounds are used as the Si and C source, the process is commonly referred to as metal-organic chemical vapor deposition (MOCVD). Any CVD or MOCVD system that can deliver these gases to a suitable reaction chamber at the proper flow rates and pressures under high purity conditions can be modified by adding a supersonic jet and be used according to the method of this invention. Other semiconductor crystals that can be grown and doped according to the method of this invention include, for examples: silicon doped with phosphorous or aluminum, diamond doped with nitrogen or boron and gallium nitride doped with silicon or magnesium. In each case, the dopant level can be altered by changing the energy of the dopant when it impinges on the growing film.

The continuum flow of the high density beam in the nozzle allows a special method for achieving beam energies beyond those available from thermal velocities. In a mixture of two gasses, if there are enough collisions in the expansion process to maintain energy and momentum equilibrium between the two gasses, the mixture will have a uniform temperature and velocity after expansion. If a small amount of heavy gas is mixed (seeded) with a light gas, the heavy species will attain the velocity of the light gas, but have a kinetic energy increase by the mass ratio of the two species.

In practice, heavy gases are entrained in a flow of hydrogen or helium at ratios of 1:100 to increase the kinetic energy of the heavy species. For SiC doping, the use of nitrogen or trimethylaluminum (TMA) in a hydrogen gas is preferable for the seeded beam technique. For example, using a 0.05% mixture of nitrogen entrained in a hydrogen supersonic beam with an initial pressure of 1000 Torr would yield a beam energy of approximately 1.36 eV at room temperature using an unskimmed system. TMA could obtain an energy of 3.06 eV under the same conditions of pressure, temperature and carrier gas.

The seeded beam method is valid in the 1% seed gas ratio for flows with Mach number greater than four. An interesting feature of this method is the increase of the heavy gas in the beam due to a "focusing" effect on the heavy gas. The increase in the reactant flux over effusive sources can be as high as 1000, but then the dilution of the reactant gas by the carrier gas reduces the increase by a factor of 100. This apparent loss in reactant flux is compensated by the higher effective Mach number of the heavy gas at the beam skimmer. The heavy species is focused along the forward expansion direction; experimental measurements of 1% nitrogen in hydrogen beams show a final concentration of 14% nitrogen in the skimmed beam.

The supersonic flows can be continuous or they may be pulsed. There are several advantages of using a pulsed source. The most obvious is the reduction in required gas volumes. This leads to a reduction in pumping speed and a simplified and cheaper vacuum system. Another advantage of pulsed beams is an increase in beam intensity due to less scattering, giving more control over deposition parameters. In contrast to effusive molecular beams, supersonic beams have a higher average velocity and narrower velocity distribution and can be switched in milliseconds. Consequently, an accurate supply of high energy molecules can be delivered to the surface.

The energy of the supersonic beam can be changed using a number of methods that either change the terminal velocity of the supersonic beam or change the mass ratio between the seed (dopant) gas and the supersonic beam (carrier) gas. The terminal velocity can be estimated using the equation:

$$V_T = M \sqrt{\frac{\gamma R T_0}{W} \left(1 + \frac{\gamma - 1}{2} M^2\right)^{-1/2}} \quad \text{(Eq. 2)}$$

where $V_T$ is the terminal velocity, M is the mach number, $T_o$ is the initial temperature of the gas, W is the mass of the gas, and $\gamma$ is the ratio of the heat capacities.

By changing the source temperature or mach number (at low mach numbers), the velocity of the supersonic beam (and thus its energy) can be modified. Also, by using dilute mixtures of the dopant gas in a lighter carrier gas the velocity of the dopant gas can obtain the same velocity as the carrier gas and it can be shown that the translational kinetic energy of the dopant atom is proportional to:

$$E_{dopant} \sim \frac{W_{dopant}}{W_{carrier}} E_{carrier} \quad \text{(Eq. 3)}$$

where $E_{dopant}$ is the energy of the dopant and $E_{carrier}$ is the energy of the carrier gas. So, changing the mass of the carrier gas will change the energy of the dopant beam with a larger mass difference giving the dopant the highest energy gain. By mixing two carrier gases having different masses, the energy of the dopant in the supersonic beam can be continuously varied. The translational kinetic energy imparted to the dopant gas in this mixture is given to a good approximation by:

$$E_i = RTW_i \left( \frac{X_1\left[\frac{\gamma_1}{\gamma_1 - 1}\right] + X_2\left[\frac{\gamma_2}{\gamma_2 - 1}\right]}{X_1 W_1 + X_2 W_2} \right) \quad \text{(Eq. 4)}$$

where $X_1$ and $X_2$ are the mole fractions of the two carrier gases (of mass $W_1$ and $W_2$) being mixed and Wi is the mass of the seed (dopant) gas.

EXAMPLES

We grew twelve doped SiC samples using a variety of carrier gases mixed with different dopants at various concentrations. After growth of films, the dopant level of the samples was determined by electrical characterization (CV and Hall analysis) and secondary ion mass spectroscopy (SIMS) depth profiling measurements. SIMS measurements yielded the most direct measurements of the doping level as a function of dopant concentration and carrier gas.

A simplified design of the growth chamber of FIG. 1 was used. A skimmer was not used. The growth system also contained a reflection high energy electron diffraction (RHEED) gun (not shown). Three General Valve series 9 pulse valves (one for each gas) having a 0.5 mm aperture, an Alcatal 450 L/S turbomolecular pump and an Advanced Ceramics pBN coated graphite heater were used. The pulser valves are water cooled during deposition to keep them at a constant temperature during growth.

Figure 2:
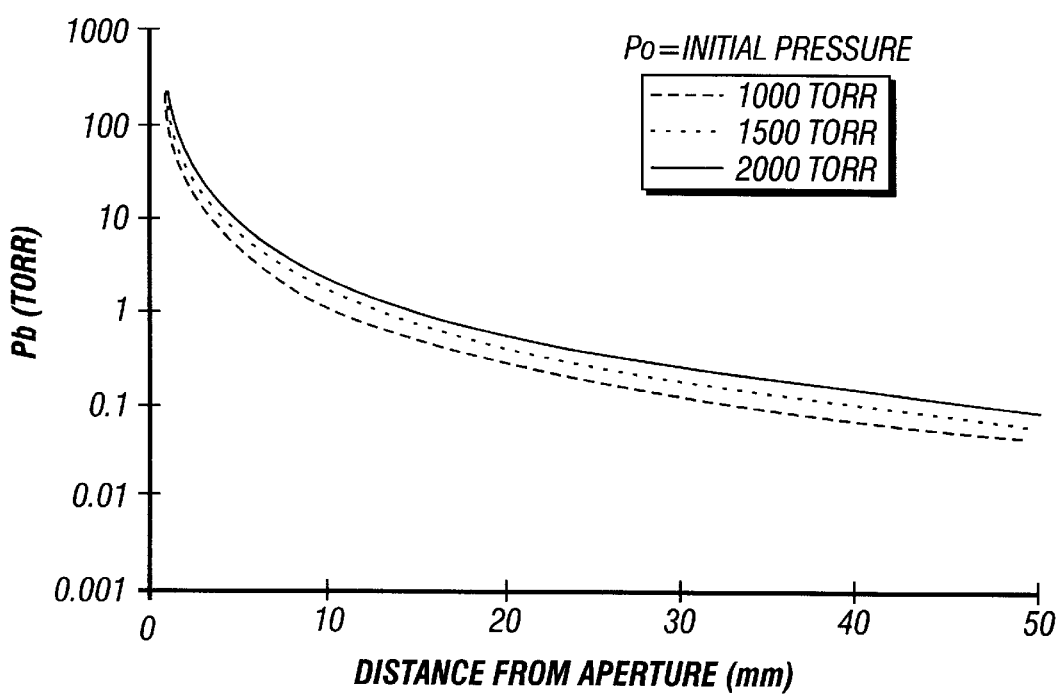
FIG. 2 is a graph of the calculated stagnation distance for supersonic beams entering a growth chamber at different gas pressures.

The system was used to grow silicon carbide by pulsing seeded supersonic beams of a propane/hydrogen mixture and silane/hydrogen mixture on the substrate heated to 1230° C. We added a third pulsed beam for the dopant. In order to have the supersonic beams strike the surface before they thermalize, the sample was placed inside the stagnation zone (the area where the beam remains supersonic). The calculated stagnation distance as a function of background pressure for three different gas pressures is shown in FIG. 2 (calculated from Eq. 1, above). The chamber did not use a skimmer so a source-to-sample distance of about 30 mm was chosen. As can be seen in FIG. 2, this distance is significantly closer than the stagnation distance as long as the pressure in the chamber remains below 0.1 Torr.

To ensure that the pressure in the growth chamber remained below 0.1 Torr during deposition, the chamber was pumped by a 450 l/s turbomolecular pump which was backed by a 30 CFM Leybold roughing pump. The chamber had a base pressure of $<1\times10^{-8}$ Torr. The vacuum system could keep a pressure well below 0.1 Torr necessary for the supersonic beam to strike the sample using a 2 Hz pulse rate with the pulser valves opened for ~3 milliseconds per pulse. The maximum sample temperature that could be reached using the pBN heater was approximately 1300° C., as determined by a tungsten/tungsten-rhenium thermocouple placed on the crystal surface.

We used molecular nitrogen as the n-type dopant and trimethylaluminum (aluminum) as the p-type dopant. Silicon carbide films were grown using beams of 0.5% silane and 0.5% propane in hydrogen and doped using supersonic beams of nitrogen and trimethylaluminum (TMA) seeded in various carrier gases. The nitrogen was seeded in the hydrogen carrier gas by pre-mixing the gases in a pressurized cylinder then introducing the gas mixture through the pulse valve. The TMA was seeded by passing the carrier gas over the TMA which was kept at a constant temperature (with a constant vapor pressure) in a bath. Table I shows the energy of both dopant beams as a function of temperature for a hydrogen carrier gas and Table II shows the energy of both dopants using hydrogen, helium, and argon as the carrier gases at room temperature.

TABLE I

| Temperature (° K.) | Energy Hydrogen | Energy (mass 72) Trimethylaluminum | Energy (mass 28) Nitrogen |
|---|---|---|---|
| 200 | 0.059 eV | 2.14 eV | 0.83 eV |
| 300 | 0.089 | 3.21 | 1.24 |
| 400 | 0.119 | 4.38 | 1.66 |
| 500 | 0.149 | 5.34 | 2.08 |

TABLE II

| Carrier Gas (mass) | Energy of carrier gas | Energy (mass 72) Trimethylaluminum | Energy (mass 28) Nitrogen |
|---|---|---|---|
| H (2) | 0.089 eV | 3.21 eV | 1.24 eV |
| He (4) | 0.065 | 1.16 | 0.451 |
| Ar (40) | 0.006 | 0.12 | 0.045 |

These calculations were performed using Eq. 3.

Of the total of twelve doped silicon carbide samples, six were doped with nitrogen using molecular nitrogen as the dopant source and six were doped with aluminum using trimethylaluminum (TMA) as the dopant source. Three nitrogen-doped samples were grown on Cree 4H SiC (0001) substrates n-doped to $1.2\times10^{19}$/cc, three nitrogen doped samples were grown on Cree 6H SiC(0001) substrates p-doped to $6\times10^{18}$/cc, and the TMA-doped samples were grown on Cree 6H SiC(0001) substrates n-doped to $8.2\times10^{17}$/cc. Table III summarizes the growth conditions for the twelve films.

TABLE III

| Sample # | Substrate | Substrate Doping | Epilayer Dopant | Concentration of Dopant | Vapor Pressure (Torr) |
|---|---|---|---|---|---|
| 1 | 4H n-type | 1.22E+19 | $N_2$/Ar | 0.005% | |
| 2 | 4H n-type | 1.22E+19 | $N_2$/$H_2$ | 0.005% | |
| 3 | 4H n-type | 1.22E+19 | $N_2$/He | 0.005% | |
| 4 | 6H n-type | 8.2E+17 | $(CH_3)_3Al$/$H_2$ | 0.027% | 0.418 |
| 5 | 6H n-type | 8.2E+17 | $(CH_3)_3Al$/He | 0.027% | 0.418 |
| 6 | 6H n-type | 8.2E+17 | $(CH_3)_3Al$/Ar | 0.027% | 0.418 |
| 7 | 6H n-type | 1.0E+18 | $N_2$/$H_2$ | 0.05% | |
| 8 | 6H n-type | 1.0E+18 | $N_2$/He | 0.05% | |
| 9 | 6H n-type | 1.0E+18 | $N_2$/Ar | 0.05% | |
| 10 | 6H n-type | 8.00E+17 | $(CH_3)_3Al$/Ar | 0.74% | 11.6 |
| 11 | 6H n-type | 8.00E+17 | $(CH_3)_3Al$/He | 0.74% | 11.6 |
| 12 | 6H n-type | 8.00E+17 | $(CH_3)_3Al$/$H_2$ | 0.74% | 11.6 |

Growth took place by operating three supersonic gas beams simultaneously—a beam of 0.5% silane in hydrogen, a beam of 0.5% propane in hydrogen and a beam of different carrier gases mixed with both the p- and n-type dopant source gases at two different concentrations. The gas sources were pulsed during growth to reduce the gas load. Typically the sources were pulsed simultaneously at 2 Hz with the gas on for 3 milliseconds per pulse. The substrate temperature was approximately 1150–1230° C. during growth as determined using atungsten/tungsten rhenium thermocouple placed on the sample surface. The growth runs typically lasted 20,000 pulses, resulting in ~0.5 to 1.0 micron thick doped homoepitaxial film. SEM analysis of all samples showed relatively smooth surfaces indicating good homoepitaxial growth. Diffraction patterns were taken before and after growth. The quality of the patterns did not change, indicating good quality crystal growth.

Samples 1–3, 7–9 (nitrogen doped) and 10–12 (aluminum doped) were analyzed by secondary ion mass spectrometry (SIMS) analysis. Samples 7–12 were patterned for Hall and CV (capacitance versus voltage) analysis. Ohmic contacts were placed on the samples by shadow masking the surface then evaporating nickel to form the contacts. The samples were annealed to 600° C.–900° C. after deposition. The contacts were tested by measuring current vs voltage (I-V) curves between contacts to insure that the contacts where ohmic.

Dynamic secondary ion mass spectroscopy (SIMS) analysis was performed on six nitrogen doped samples grown using two nitrogen seed gas concentrations (samples 1,2,3, 7,8,9) and three aluminum doped samples (samples 10,11 and 12) using a CAMECA IMS-3f double-focusing, magnetic sector ion microanalyzer. Samples 1,2, and 3 were grown on nitrogen-doped 6H SiC substrates using a nitrogen concentration of 0.005% in argon, hydrogen and helium respectively. Samples 7, 8 and 9 were grown on aluminum-doped 6H substrates using a nitrogen concentration of 0.05% in hydrogen, helium and argon respectively. Finally, samples 10, 11, and 12 were grown on nitrogen-doped 4H substrates with TMA vapor pressure of 0.74% in argon, helium, and hydrogen respectively.

For the nitrogen-doped silicon carbide, cesium ions were used for measurement of the doping concentration. Unfortunately, nitrogen forms a very poor secondary ion so nitrogen was measured using C+N$^-$ as the secondary ion. Silicon could not be used, since the $^{28}$Si+$^{14}$N$^-$ molecular ion occurs at the same nominal mass as $^{30}$Si+$^{12}$C$^-$. For the aluminum-doped samples, an oxygen primary ion beam was utilized with positive secondary ion detection. For aluminum detection, adequate mass resolution was utilized to discriminate against $^{11}$B+$^{16}$O$^+$ and $^{12}$C$_2$+$^1$H$_3^+$ ions which can occur at the same nominal mass as aluminum. An aluminum-doped substrate of known doping level was used for calibration of the absolute doping level.

The initial SIMS data for the nitrogen samples 1,2 and 3 indicated nitrogen concentrations that were below the instrumental detection level for the nitrogen dopant. Because this data was inconclusive, three additional samples (sample 7,8 and 9) were grown on p-doped substrates using a higher nitrogen concentration in the supersonic dopant beam. SIMS measurements on these samples showed that the nitrogen doping level in the epilayer was higher than the substrate and the noise floor, indicating that the measured SIMS levels for the epilayer are real. However, the doping level was measured to be the same, 0.05% for all three carrier gases, as shown in Table III. In all cases the nitrogen dopant level was about 2×10$^{18}$/cc in the epilayer. There was also some signal for nitrogen in the substrate, which may indicate the minimum detectable level.

Figure 3:
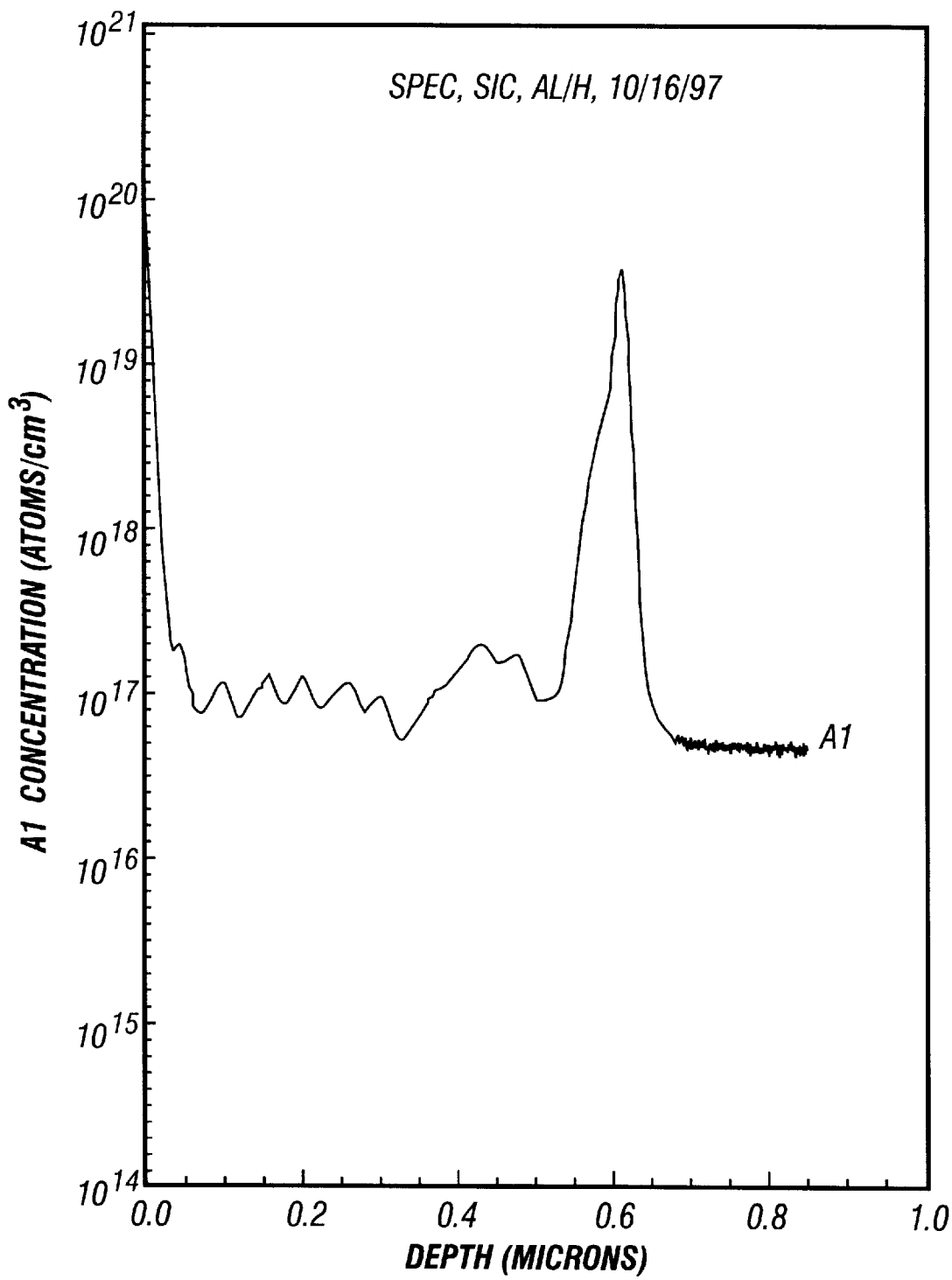
FIG. 3 is a graph of the SIMS depth profile measurements for sample 12.
Figure 4:
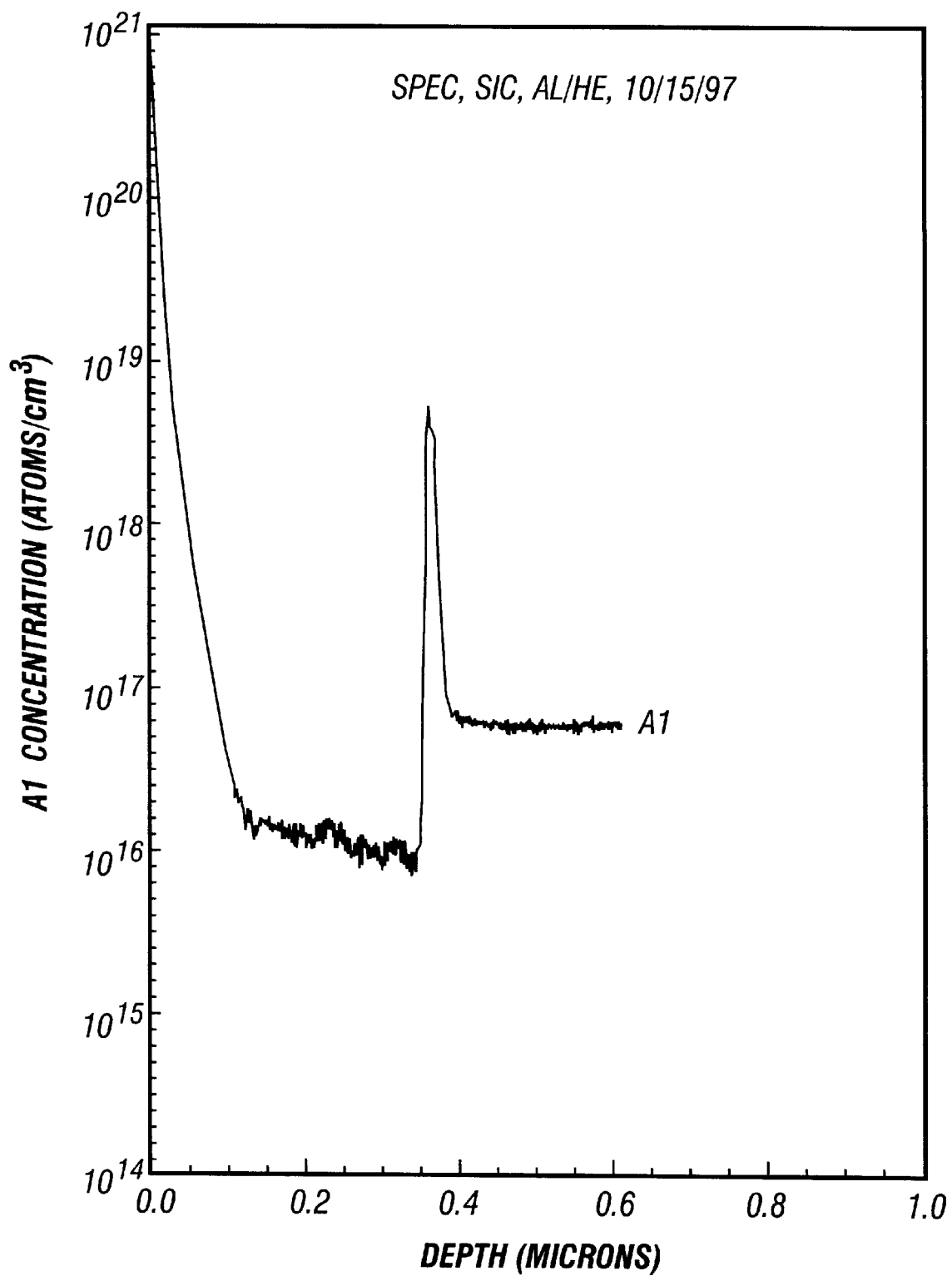
FIG. 4 is a graph of the SIMS depth profile measurements for sample 11.
Figure 5:
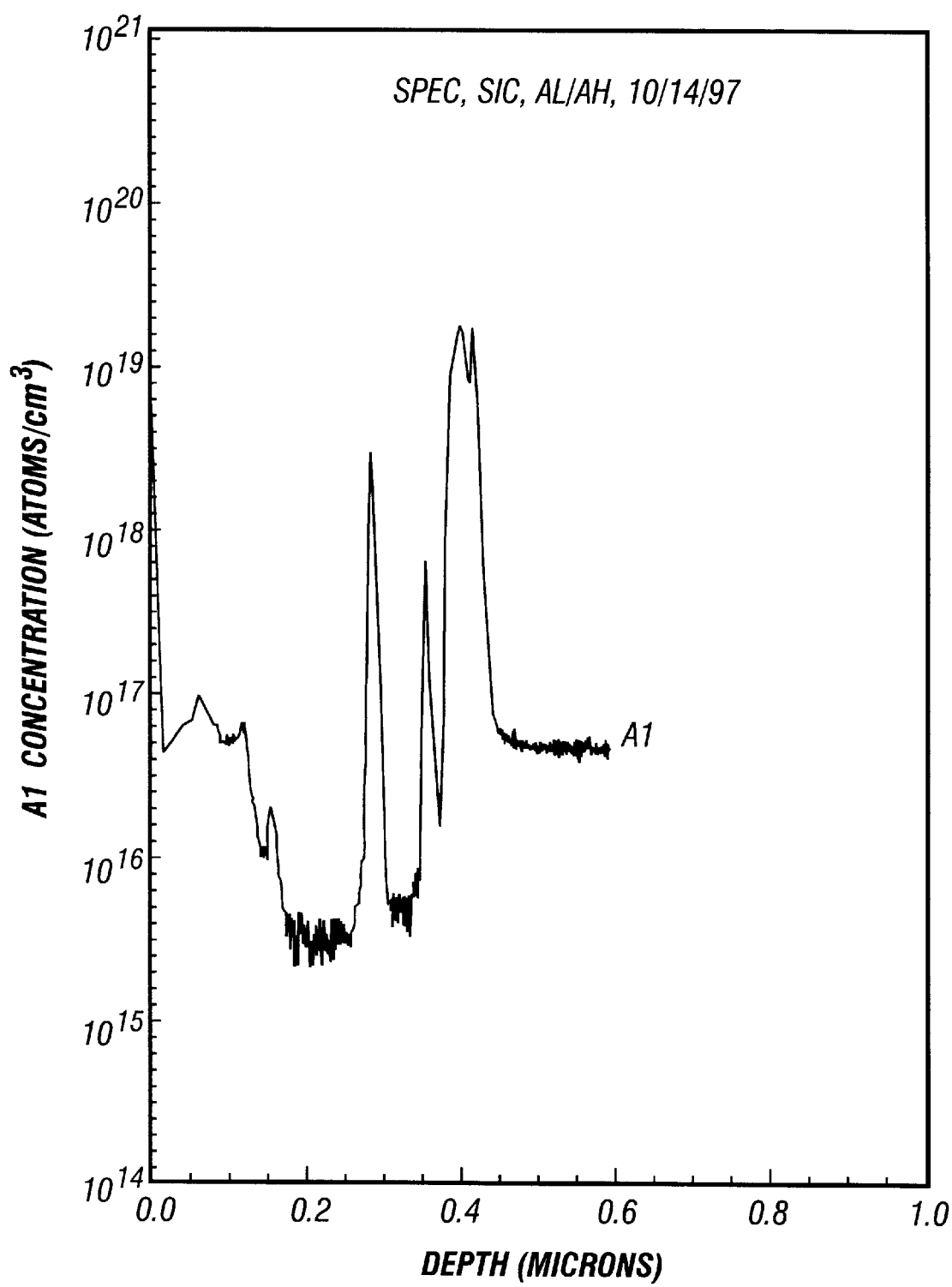
FIG. 5 is a graph of the SIMS depth profile measurements for sample 10.

The SIMS results for the three aluminum doped samples, samples 12, 11, and 10, shown in FIGS. 3, 4 and 5, respectively, show much more positive results. These SIMS data indicate a definite dependence of the doping level on the energy of the dopant. Using the same percentage of trimethylaluminum, we find a doping level of about 1×10$^{17}$/cc using a hydrogen carrier gas, a doping level of about 1×10$^{16}$/cc using a helium carrier gas and a doping level of about 5×10$^{15}$/cc using an argon carrier gas. In all three SIMS measurements there are large aluminum concentrations at the surface and at the epitaxial layer/substrate interface. In addition, in FIG. 3, we see large peaks in the aluminum concentration in the epitaxial layer. This is probably due to a growth interruption during growth to replace the silane bottle.

Van der Pauw resistivity versus voltage and Hall mobility measurements were also made on some samples. Table IV summarizes the results.

TABLE IV

| Sample | Dopant/ | Van der Pauw | Hall mobility | Hall coefficient | Carrier |
|---|---|---|---|---|---|
| 7 | N/H | 0.064 | 23.4 | 1.49 | 4.2E+18 |
| 8 | N/He | 0.035 | 20.9 | 0.74 | 8.4E+18 |
| 9 | N/Ar | 0.032 | 20.5 | 0.65 | 9.6E+18 |
| 10 | Al/Ar | * | * | * | * |
| 11 | Al/He | 1.59E−4 | 92.0 | 1.46E−2 | 4.3E+20 |
| 12 | Al/H | 1.63E−4 | 89.1 | 1.45E−2 | 4.3E+20 |

*Sample #10 (aluminum in an argon carrier gas) cracked during SIMS analysis.

These measurements were made with a Keithley Hall measurement system and a Hewlett Packard CV system. Van der Pauw resistivity and Hall mobility measurements were made on the nitrogen-doped samples grown on p-doped substrates (samples 7, 8, and 9) and on aluminum-doped samples grown on n-doped substrates (samples 11 and 12). The carrier concentration for the n-doped epitaxial layer agrees well with the SIMS data. The p-doped epilayer data may be indicative of the high aluminum surface concentration seen in the SIMS data.

Figure 6:
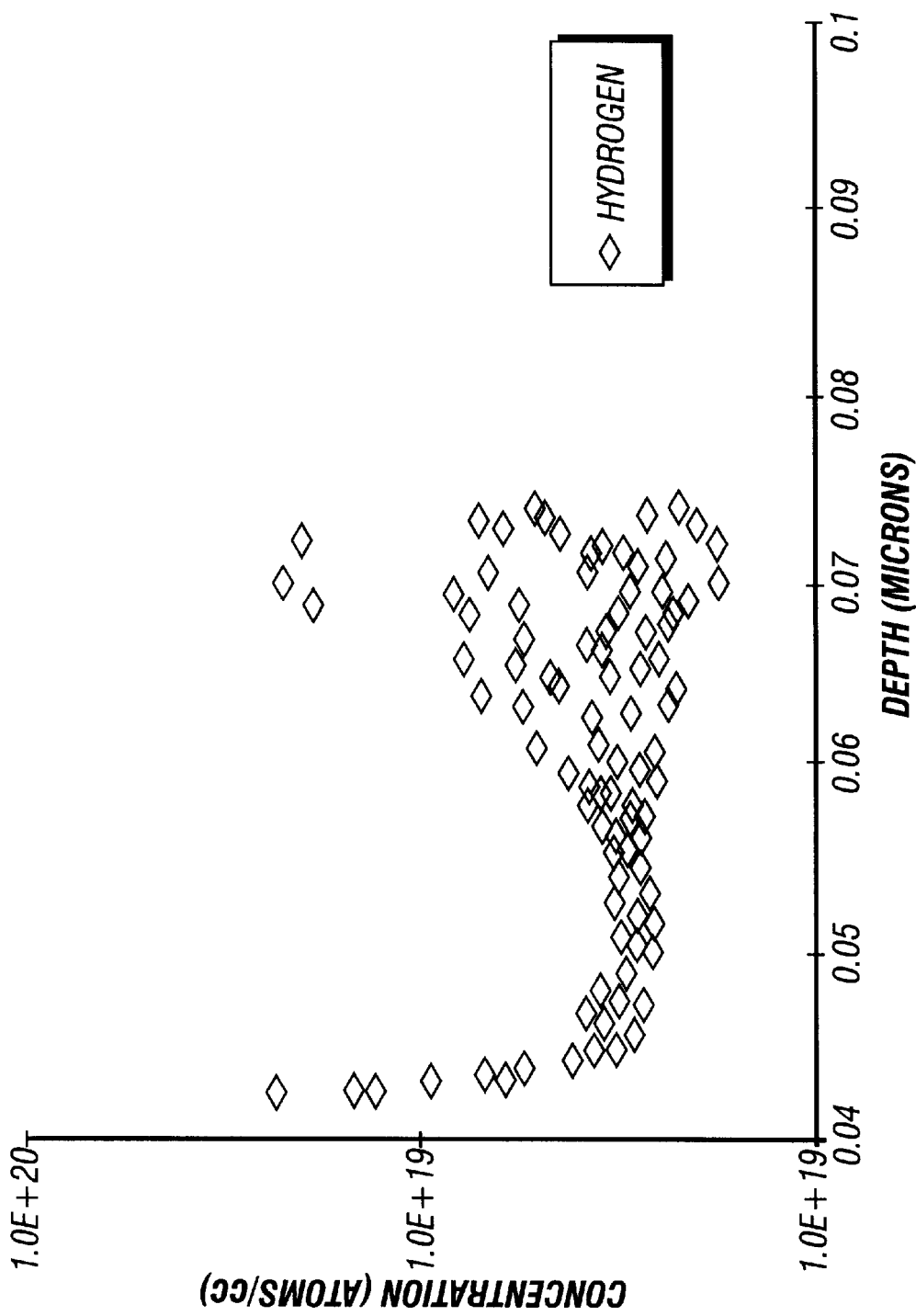
FIG. 6 is a graph of carrier concentration vs. depth for sample 2.

In addition we made capacitance versus voltage (CV) measurements of samples 1–3 to determine the carrier concentration as a function of depth in the epilayer. FIG. 6 shows a carrier concentration curve of sample 2 which is representative of the measurements on these samples. In this data we find a high doping level at the surface (which is consistent with the SIMS measurements) but we cannot probe very deep into the epilayer due to limitations of the equipment used for this measurement. There is also a lot of noise as the signal diminishes at greater depths.

We found a dependence of the doping level on dopant energy using trimethylaluminum (mass 72) as a p-type dopant. However, using molecular nitrogen as the n-type dopant showed little or no energy dependence. This is believed due to the lower final translational energy of nitrogen molecules as compared with trimethylaluminum, indicating a minimum or activation energy needed to achieve the expected effect. The lack of energy dependence for molecular nitrogen may also be due to the high dissociation energy of the nitrogen molecule. Larger nitrogen-containing molecules can be used as n-type dopants to overcome the lack of energy dependence.

Figure 7:
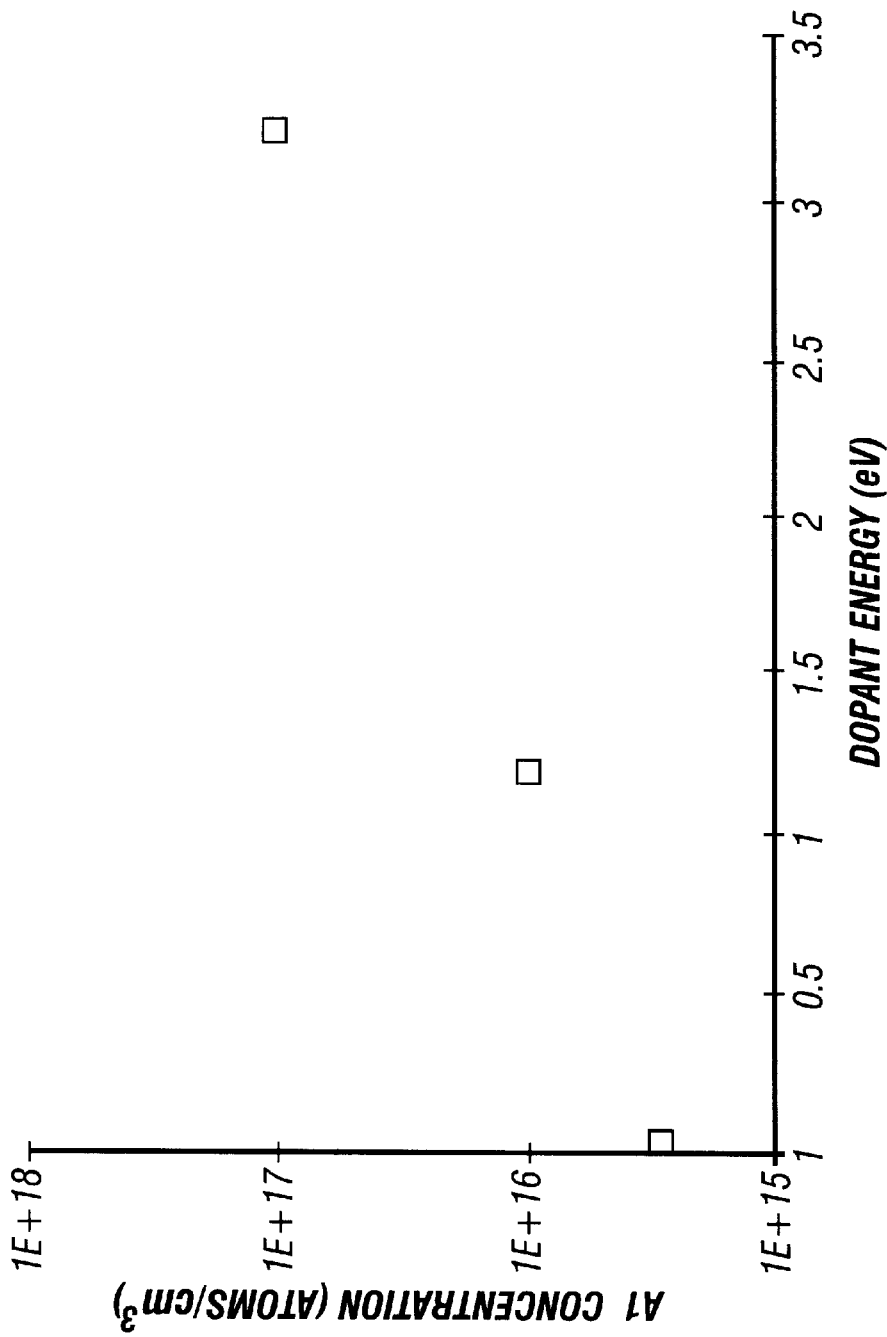
FIG. 7 is a graph of dopant concentration in SiC vs. dopant energy of trimethylaluminum.

FIG. 7 shows the doping level of the SiC film vs energy for the trimethylaluminum dopant for the aluminum-doped samples (samples 10, 11, and 12). The results show a logarithmic dependence of the dopant concentration as a function of energy. This behavior is typical of a rate-controlled process governed by an energy activation barrier.

The data clearly demonstrate that it is possible to vary the dopant concentration in SiC epitaxial layers by changing the kinetic energy of arriving dopant molecules during growth and that this variation can be achieved without changing the growth species flow rate, growth temperature, or dopant flow rate. Energy-dependent doping can be realized by using a heavier molecule to carry the dopant. For nitrogen doping, a nitrogen-containing compound like acetonitrile (CH$_3$CN) or other higher molecular weight nitrogen-containing compound should be used.

With the variation of dopant concentration with carrier gases having different molecular weight, it is possible to design a method to smoothly or abruptly vary the dopant energy (and thus the dopant level) by mixing carrier gases. This dopant system can then be incorporated into a SiC or other material growth system. Then dopant concentration can be rapidly and controllably changed during epitaxial growth by changing the carrier gas or mixture of carrier gasses. This capability will enable fabrication of new modulation-doped semiconductor devices in silicon carbide or other materials.

Although the inventors do not want to be held to one theory for this physical phenomena, it is believed that the controlled incorporation of the dopants into the SiC film layer is accomplished by manipulation of the kinetic energy of the dopant atoms as compared with the kinetic energy of the growth atoms. Increased kinetic energy of the dopant atoms leads to increased mobility on the surface and thus an increase in the doping level. Conversely, decreased kinetic energy of the dopant atoms leads to a decrease in the doping level, keeping all other conditions constant.

The invention has been described with reference to its preferred embodiments. Those or ordinary skill in the art may, upon reading this disclosure, appreciate changes or modifications which do not depart from the scope and spirit of the invention as described above or claimed hereafter.

What we claim is:

1. A method for doping a semiconductor film during epitaxial growth by chemical vapor deposition or sublimation, comprising the steps of:

providing a substrate at a selected temperature in a growth chamber having selected pressure conditions suitable for epitaxial growth;

introducing a plurality of growth precursor materials into the growth chamber;

introducing through a nozzle a supersonic beam comprising a carrier gas and a dopant gas into the growth chamber and impinging the supersonic beam onto the substrate at a first selected energy, the distance from the nozzle to the substrate and the pressure conditions in the growth chamber being selected so as to maintain supersonic flow conditions therebetween; and allowing growth to continue until a film having a selected dopant concentration and of selected thickness is formed.

2. The method of claim 1 wherein the substrate is silicon carbide and the growth precursor materials contain silicon and carbon.

3. The method of claim 2 wherein the growth precursor materials are silane and propane.

4. The method of claim 2 wherein the carrier gas in the supersonic beam is selected from the group of gases consisting of hydrogen, helium, argon and neon and mixtures thereof.

5. The method of claim 1 wherein each of the growth precursor materials is introduced into the growth chamber through a supersonic nozzle.

6. The method of claim 1 wherein the precursor materials are introduced by pulse flow.

7. The method of claim 1 wherein the dopant material is introduced by pulse flow.

8. The method of claim 1 further comprising the step of changing the energy of the supersonic beam through the nozzle containing the carrier gas and the dopant gas so as to change the selected energy from the first selected energy to a second selected energy.

9. The method of claim 8 wherein the energy is changed by changing the terminal velocity of the beam.

10. The method of claim 8 wherein the energy is changed by changing the mass ratio between the dopant gas and the carrier gas.

11. The method of claim 10 wherein the mass ratio is changed by changing a mixture of carrier gases.

12. The method of claim 1 further comprising the step of placing a skimmer in the growth chamber, the skimmer being disposed between the nozzle and the substrate.

* * * * *

UNITED STATES PATENT AND TRADEMARK OFFICE
CERTIFICATE OF CORRECTION

PATENT NO. : 6,015,459
DATED : January 18, 2000
INVENTOR(S) : Jamison et al.

It is certified that error appears in the above-identified patent and that said Letters Patent is hereby corrected as shown below:

<u>Column 1,</u>
At line 3, insert the following:
           GOVERNMENTAL RIGHTS
The U.S. Government has a paid-up license in this invention and the right in limited circumstances to require the patent owner to license others on reasonable terms as provided by the terms of N00014-97-C-0235 awarded by the Office of Naval Research.

Signed and Sealed this

Twenty-first Day of May, 2002

*Attest:*

*Attesting Officer*

JAMES E. ROGAN
*Director of the United States Patent and Trademark Office*